(12) United States Patent
Arvin et al.

(10) Patent No.: US 8,759,210 B2
(45) Date of Patent: Jun. 24, 2014

(54) CONTROL OF SILVER IN C4 METALLURGY WITH PLATING PROCESS

(75) Inventors: Charles L. Arvin, Poughkeepsie, NY (US); Wolfgang Sauter, Hinesburg, VT (US); Jennifer D. Schuler, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/552,788

(22) Filed: Jul. 19, 2012

(65) Prior Publication Data

US 2014/0021606 A1  Jan. 23, 2014

(51) Int. Cl.
*H01L 21/44* (2006.01)

(52) U.S. Cl.
USPC ............ 438/613; 438/632; 438/738; 257/737

(58) Field of Classification Search
CPC ..... H01L 21/4763; H01L 24/04; H01L 24/07; H01L 24/10; H01L 24/11; H01L 24/12; H01L 24/13; H01L 24/14; H01L 24/15; H01L 24/16; H01L 24/17
USPC .......... 438/108, 613, 632, 738; 257/737, 738, 257/778, 779, 780, E23.021, E23.069, 257/E21.508, E21.503, E21.511
See application file for complete search history.

(56) References Cited

U.S. PATENT DOCUMENTS

| | | |
|---|---|---|
| 3,361,592 A | 1/1968 | Quetsch, Jr. et al. |
| 4,187,599 A | 2/1980 | Flowers et al. |
| 5,410,184 A | 4/1995 | Melton et al. |
| 6,133,134 A | 10/2000 | Mehr |
| 6,549,413 B2 | 4/2003 | Karnezos et al. |
| 7,241,641 B2 | 7/2007 | Savastiouk et al. |
| 7,459,386 B2 | 12/2008 | Tseng et al. |
| 7,560,308 B2 | 7/2009 | Banno et al. |
| 7,723,158 B2 | 5/2010 | Gutt et al. |
| 7,829,380 B2 | 11/2010 | Irsigler et al. |
| 7,951,699 B2 | 5/2011 | Iwasaki et al. |
| 2003/0134233 A1* | 7/2003 | Su et al. ................. 430/318 |
| 2004/0251560 A1 | 12/2004 | Nakano et al. |
| 2005/0020050 A1* | 1/2005 | Huang ................. 438/613 |
| 2005/0085062 A1 | 4/2005 | Kim |
| 2009/0102062 A1 | 4/2009 | Sato et al. |
| 2010/0314756 A1* | 12/2010 | Lii et al. ................. 257/737 |
| 2011/0189848 A1 | 8/2011 | Ewert et al. |
| 2013/0087910 A1 | 4/2013 | Razak |
| 2013/0119532 A1 | 5/2013 | Lin et al. |

OTHER PUBLICATIONS

Clark, Office Action Communication for U.S. Appl. No. 13/552,792 dated Jul. 30, 2013, 17 pages.

(Continued)

*Primary Examiner* — Khiem D Nguyen
(74) *Attorney, Agent, or Firm* — David A. Cain; Hoffman Warnick LLC

(57) ABSTRACT

A solder structure for joining an IC chip to a package substrate, and method of forming the same are disclosed. In an embodiment, a structure is formed which includes a wafer having a plurality of solder structures disposed above the wafer. A ball limiting metallurgy (BLM) layer disposed beneath each of the solder structures, above the wafer. At least one of the plurality of solder structures has a first composition, and at least another of the plurality of solder structures has a second composition.

15 Claims, 10 Drawing Sheets

(56) References Cited

OTHER PUBLICATIONS

Anonymous, "Method for fine and ultra-fine mixed-pitch C4 substrate bumping using electroplating," Jul. 2006, 5 pages, Disclosure No. IPCOM000138230D, http://www.ip.com/pubview/IPCOM000138230D.

Clark, Notice of Allowance and Fee(s) Due for U.S. Appl. No. 13/552,792 dated Jan. 17, 2014, 7 pages.

* cited by examiner

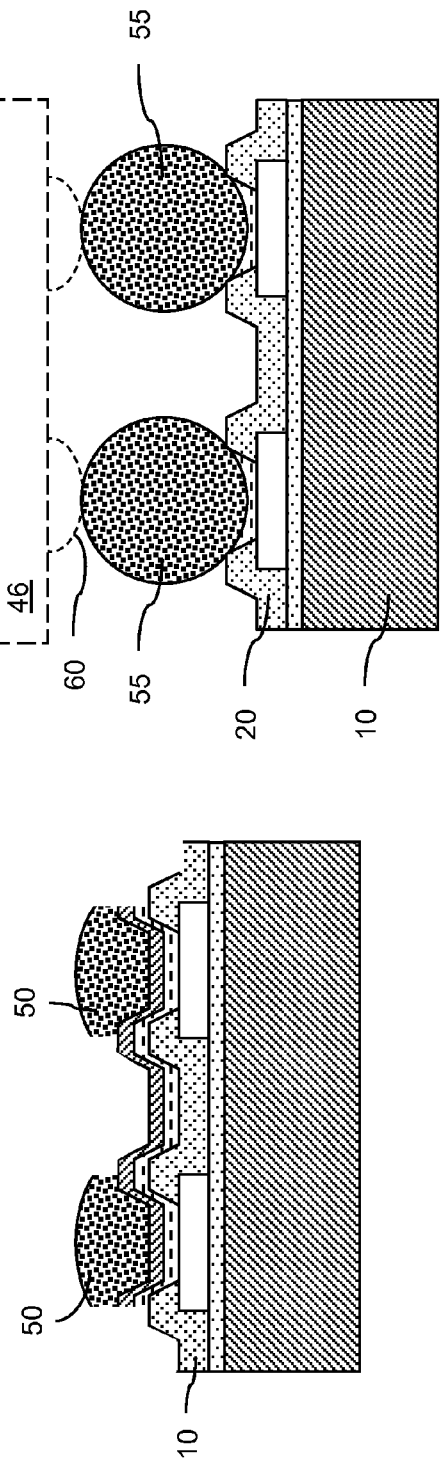
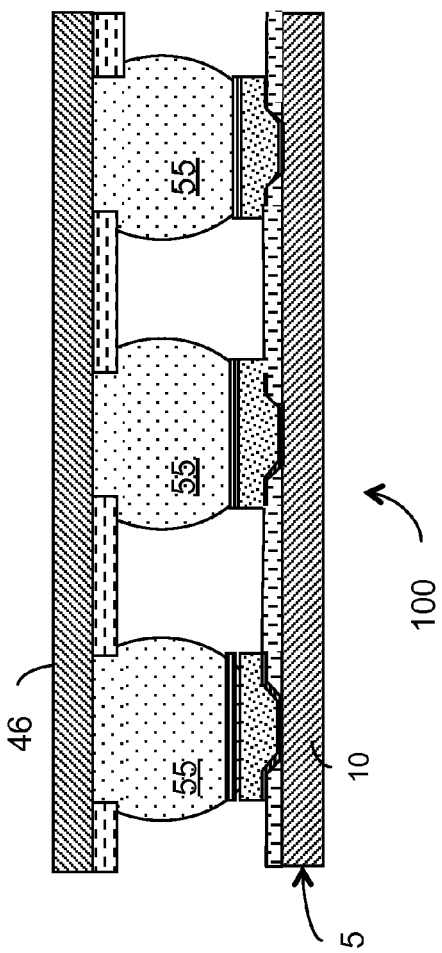

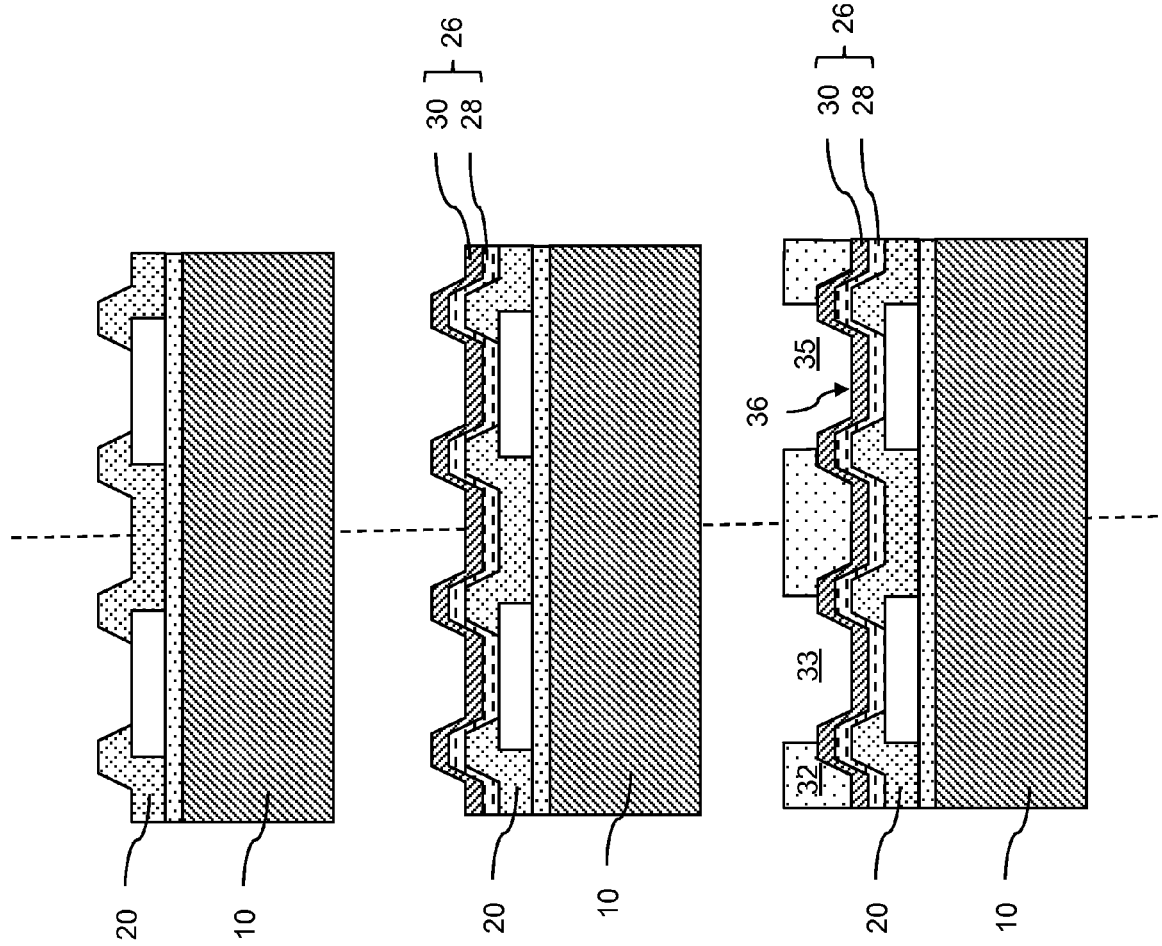

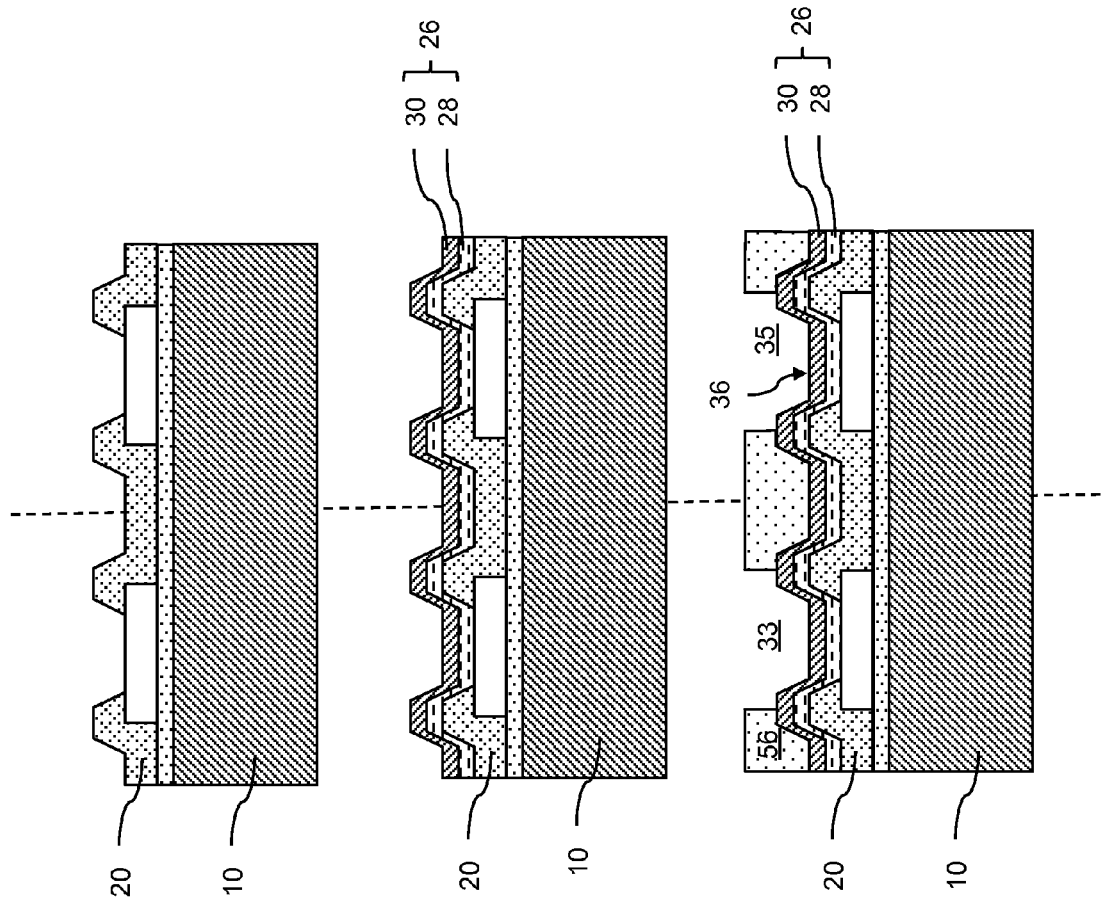

CONTROL OF SILVER IN C4 METALLURGY WITH PLATING PROCESS

FIELD

The invention relates generally to the fabrication of integrated circuit (IC) chip packages, also referred to as flip chip packages. More particularly, the invention relates to the formation of controlled collapse chip connections (C4s) having controlled metallurgical compositions for joining an IC chip to a package substrate.

BACKGROUND

A semiconductor chip, also commonly referred to as an integrated circuit (IC) chip or a die is typically assembled into an IC chip package that is soldered to a printed circuit board. The IC chip package typically includes the IC chip, which contains a number of round solder bumps that are attached to a top surface of the chip. The IC chip, via the solder bumps, is soldered to solder pads located along a surface of a package substrate, forming a metallurgical joint between the chip and the substrate referred to as a C4. C4s carry electrical current between the semiconductor chip and the substrate.

Power density in new technologies has increased dramatically, which in turn increases the current flowing through each C4 in a flip chip package. The amount of current flowing through each C4 has placed limitations on chip fabrication as a result of C4 electromigration. C4 electromigration refers to the transport of material as a result of the gradual movement of ions in a conductor due to the momentum transfer between conducting electrons and diffusing metal atoms. As atoms are transported, voids are created in the C4, leaving the C4 unable to perform its function as a conductor.

Electromigration occurs as a function of current density, making it a particular challenge in applications with particularly high current and/or particularly small C4s, each of which increases the current density. Particularly as technologies progress to the 14 nm technology node and beyond, electromigration in C4s becomes more and more of a bottleneck.

Silver content in the solder of a C4 has been shown to impact the electromigration performance of the C4. Increasing the silver content improves the electromigration performance, i.e., it decreases the occurrence of electromigration. However, increasing silver content also results in a stiffer C4, placing more stress on the chip and therefore increasing the risk of "white bumps," where the C4 exerts greater stress on the chip than the back end of line (BEOL) can withstand, resulting in a tear-out of the BEOL. Higher Ag content also limits the reflow profile options during assembly.

BRIEF DESCRIPTION OF THE INVENTION

Aspects of the invention provide a method for increasing, and structure having increased current carrying capability in selected C4s, while simultaneously avoiding the drawbacks associated with increasing silver content in all C4s on an IC chip package, including C4s which carry less current, and therefore do not require improvement in their current carrying capability.

A first aspect of the disclosure provides a structure comprising: a wafer; a plurality of solder structures disposed above the wafer; and a ball limiting metallurgy (BLM) layer disposed between each of the plurality of solder structures and the wafer, wherein at least one of the plurality of solder structures has a first composition, and at least one of the plurality of solder structures has a second composition.

A second aspect of the disclosure provides a method comprising: providing a wafer; depositing a ball limiting metallurgy (BLM) layer over a surface of the substrate; depositing a first resist layer over the BLM layer; patterning the first resist layer to create a plurality of openings in the first resist layer; depositing a second resist layer over the first resist layer; patterning the second resist layer, wherein the patterning of the second resist layer includes removing the second resist layer from an upper surface of the first resist layer adjacent to a first opening in the plurality of openings, and leaving the second resist layer on an upper surface of the first resist layer adjacent to a second opening in the plurality of openings; and electroplating a solder structure into each of the plurality of openings. A first solder structure is plated into the first opening to a height above the upper surface of the first resist layer, and a second solder structure is plated into the second opening such that it is confined by the second resist layer.

A third aspect of the disclosure provides a method comprising providing a wafer; depositing a ball limiting metallurgy (BLM) layer over a surface of the wafer; depositing a first resist layer over the BLM layer; patterning the first resist layer to create a plurality of openings; etching the first resist layer, wherein etching the first resist layer includes removing a partial thickness of the first resist layer from an upper surface of the first resist layer adjacent to a first opening, and leaving a full thickness of the first resist layer adjacent to a second opening; electroplating a solder structure into each of the plurality of openings, wherein a first solder structure is plated into the first opening to a height above the upper surface of the first resist layer, and wherein a second solder structure is plated into the second opening such that it is confined by the second resist layer.

These and other aspects, advantages and salient features of the invention will become apparent from the following detailed description, which, when taken in conjunction with the annexed drawings, where like parts are designated by like reference characters throughout the drawings, disclose embodiments of the invention.

BRIEF DESCRIPTION OF THE DRAWINGS

FIGS. 1A-G show a conventional method of plating controlled collapse chip connections (C4s).

FIGS. 2A-F show a method of plating C4s in accordance with an embodiment of the invention.

FIGS. 3A-F show a method of plating C4s in accordance with an embodiment of the invention.

DETAILED DESCRIPTION OF THE INVENTION

As indicated above, aspects of the invention provide a C4 structure having improved current carrying capability, and a flip chip including at least one such C4 structure.

Figure 1A:
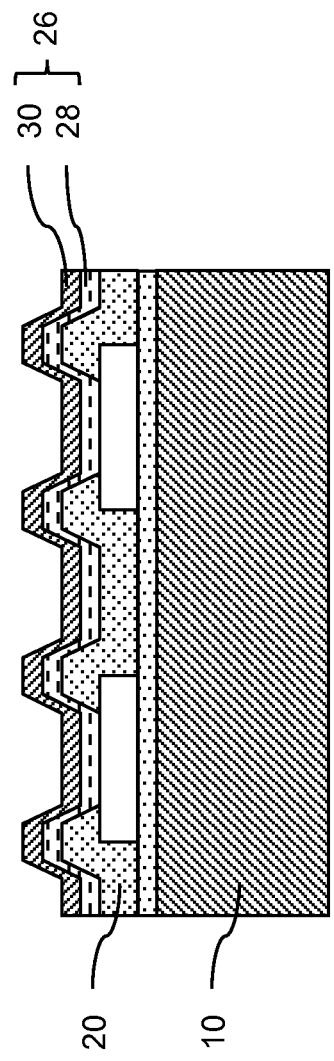

Referring to the drawings, FIGS. 1A-F show a conventional method of forming a C4. As shown in FIG. 1A, a wafer 10 is provided which may include a number of electronic circuits manufactured by lithographic processes or patterned diffusion of trace elements into the surface of a wafer 10 in a conventional manner. Wafer 10 may further include a polyimide passivation layer 20 deposited over wafer 10.

A ball limiting metallurgy (BLM) layer 26 may be deposited on an upper surface of the IC chip. BLM layer 26 includes a first layer 28 over passivation layer 20, and a second layer 30 over first layer 28. In various embodiments, first layer 28 of BLM layer 26 may comprise Ti or TiW, and second layer 30 may comprise one of Cu, Ni, or an alloy. Various combinations of materials for first layer 28/second layer 30 exist. In one embodiment, first and second layers 28/30 may be TiW/Cu. In other embodiments, first and second layers 28/30 may be Ti/Ni, Cr/Cu/Au, or Al/NiV/Cu. Regardless of material, second layer 30 of BLM layer 26 provides a redundant conductor between wafer 10 and package 46 in future steps (FIG. 1F).

Figure 1B:
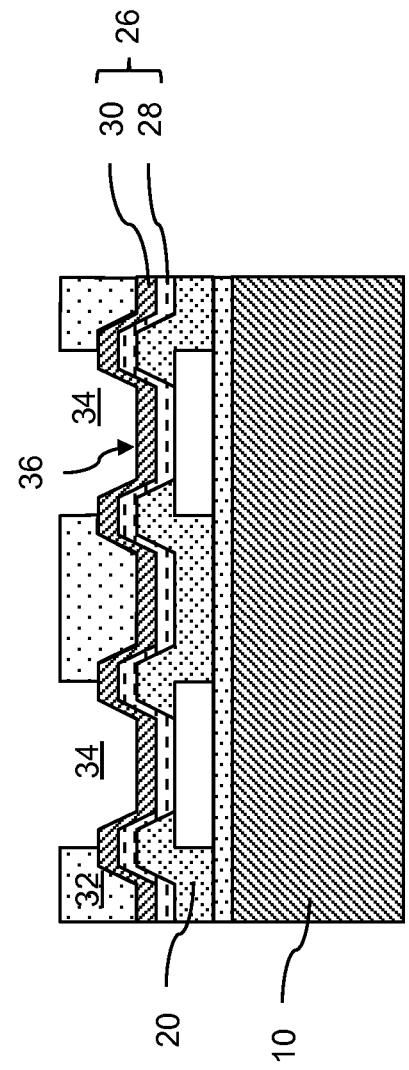

As shown in FIG. 1B, a first resist layer 32 is applied over the whole wafer. Either a dry film or a liquid resist may be used. A lithography process is then used to expose and develop the resist, to create openings 34 in first resist layer 32 for the formation of C4 solder structures. An upper surface 36 of BLM layer 26 is exposed in openings 34.

Figure 1C:
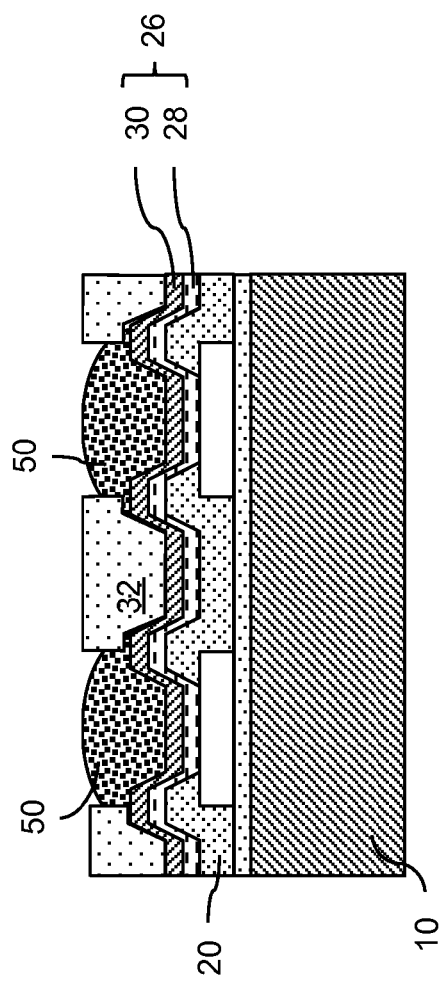

As shown in FIG. 1C, solder structures 50 are deposited by electroplating on surface 36 in openings 34. Solder structures 50 may be made of, e.g., Sn, SnCu or SnAg. In subsequent processing steps, solder structures 50 will be incorporated into controlled collapse chip connections (C4s).

Figure 1D:
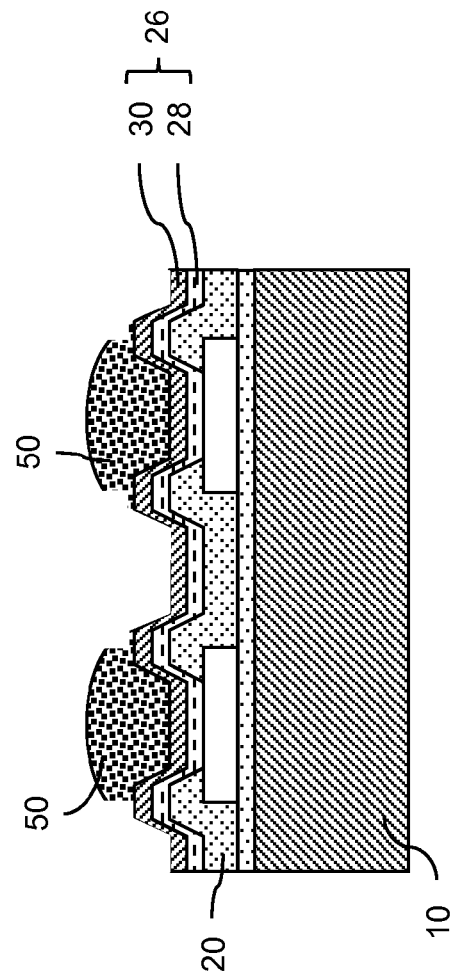

As shown in FIG. 1D, after the deposition of solder structures 50, first resist layer 32 (FIG. 1C) is stripped away. As shown in FIG. 1E, exposed portions of BLM layer 26, i.e., where BLM layer 26 is not beneath solder structures 50, are etched using, e.g., ammonium persulphate (for copper), or hydrogen persulfate or HF (for TiW or Ti) and $O_2$ plasma. As shown in FIG. 1F, solder structures 50 (FIG. 1E) are then reflowed to form substantially spherical solder balls 50. Then package 46 is placed above wafer 10 such that solder structures 50 substantially align with solder pads 60 on package 46 substrate. Solder pads 60 and solder structures 50 are then reflowed, forming a C4 55 joining wafer 10 to a package 46 in IC chip package 100 as shown in FIG. 1G.

Once an assembled in a flip chip package 100 as described above, C4 structures 55 carry different amounts of current related in part on their location on the chip. A majority of C4s 55 carry relatively low current, for example, less than 150 mA. A small number of C4s 55, typically located near the core of the chip, carry much greater current. These C4s 55 may carry, for example, 150-180 mA or in excess of 180 mA of current. These comparatively high currents result in a relatively high failure rate among solder structures 50. The top 1% or less of C4s 55 carrying the greatest current typically account for 96% or more of the C4 failures on a chip.

The distribution of these high current-carrying C4s can be mapped, so that their locations can be identified. An allowable rate of failure, e.g., as a result of electromigration, can be determined. Using the allowable failure rate, a cut-off can be determined beyond which high current-carrying C4s should be selectively formed with a metallurgical composition which results in improved current carrying capability with decreased electromigration.

A method of selectively forming solder structures having a higher current carrying capability, i.e. a greater ability to conduct current without undergoing significant electromigration, will now be described with reference to FIGS. 2A-F.

As shown in FIG. 2A, a wafer 10 is provided which may include a number of electronic circuits manufactured by lithographic processes or patterned diffusion of trace elements into the surface of a wafer 10 in a conventional manner, and may further include a polyimide passivation layer 20 as described above with respect to FIG. 1A.

In FIG. 2B, BLM layer 26 is deposited over a surface of wafer 10. BLM layer 26 may include first layer 28 and second layer 30 as described previously. As shown in FIG. 2C, a first resist layer 32 is deposited over BLM layer 26. First resist layer 32 may be patterned to create a plurality of openings 34 in first resist layer 32.

Figure 2D:
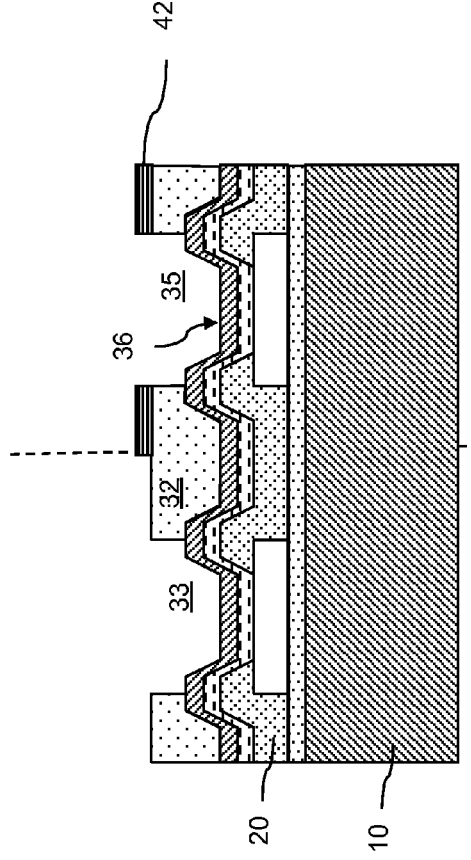

As shown in FIG. 2D, second resist layer 42 may then be deposited over first resist layer 32, and subsequently patterned to remove second resist layer 42 from an upper surface of first resist layer 32 adjacent to a first opening 33. This leaves second resist layer 42 remaining on an upper surface of the first resist layer 32 adjacent to a second opening 35. Second opening 35 is thus deeper than first opening 33, owing to the additional thickness provided by second resist layer 42.

Figure 2E:
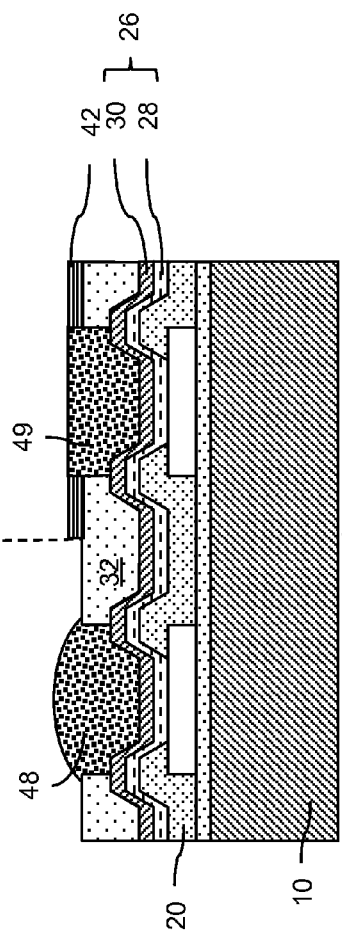

As shown in FIG. 2E, solder structures 48, 49 are deposited in first opening 33 and second opening 35 (FIG. 2D) respectively, e.g., by electroplating. In an embodiment, first solder structure 48 and the second solder structure 49 may comprise SnAg. Both first and second solder structures 48, 49 are plated until second solder structure 49 attains a height substantially equivalent to the depth of second opening 35. Second opening 35 is thus filled, but second solder structure 49 remains confined by the side walls of second opening 35 formed by first and second resist layers 32, 42.

As first opening 33 is shallower than second opening 35 owing to the lack of second resist layer 42 adjacent to first opening 33, first solder structure 48 is plated to a height above the upper surface of first resist layer 32. First solder structure 48 is allowed to plate over the top of the upper surface of first resist layer 32, overflowing nominally out of first opening 33, which is referred to as mushroom plating.

The silver content in a SnAg electroplating deposit is dependent upon the surface concentration of Ag in the plating bath. A plating bath that produces about 1.7% Ag deposited within the confines of first resist layer 32 and second resist layer 42 in second opening 35, will produce an approximately 4% Ag solder structure 48 that extends above first resist layer 32 as in first opening 33. These compositions and percentages of silver are merely exemplary; various plating baths may be used which may produce first solder structures 48 and second solder structures 49 that have different relative amounts of silver. Regardless, the mushroom plating technique produces a first solder structure 48 which has a higher percentage of silver than a composition of the second solder structure 49, despite being plated simultaneously.

Figure 2F:
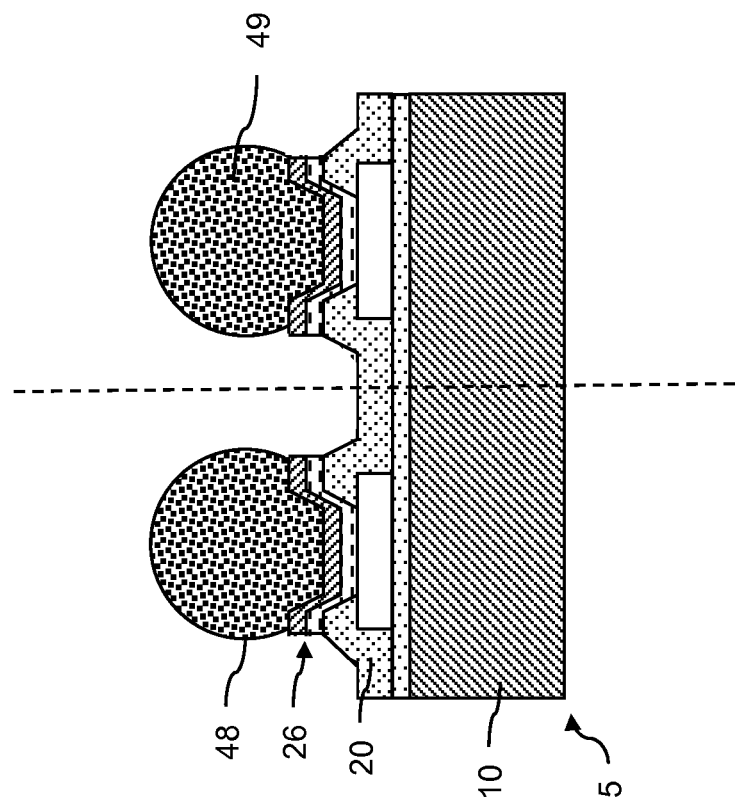

As shown in FIG. 2F, first resist layer 32 (FIG. 2E) and second resist layer 42 (FIG. 2E) may be stripped away as described above relative to FIG. 1D. Exposed portions of BLM layer 26, i.e. portions not beneath first and second solder structures 48, 49, may be etched and first and second solder structures 48, 49 may be reflowed and annealed, joining substrate 10 to a package (not shown), also as described above relative to FIG. 1D-F.

Thus formed, first solder structure 48 may have a current carrying capacity of greater than 150 mA, and may particularly be capable of carrying current in excess of 180 mA substantially without undergoing electromigration. Second solder structure 49, by contrast, may have a current carrying capacity of, e.g., less than 150 mA, but is less stiff than first solder structure 48 owing to its relatively lower silver concentration.

Another method of selectively forming solder structures having a higher current carrying capability, i.e. a greater ability to conduct current without undergoing significant electromigration, will now be described with reference to FIGS. 3A-F.

As shown in FIG. 3A, a wafer 10 is provided which may include a number of electronic circuits manufactured by lithographic processes or patterned diffusion of trace elements into the surface of a wafer 10 in a conventional manner, and may further include a polyimide passivation layer 20 as described above with respect to FIG. 1A.

In FIG. 3B, BLM layer 26 is deposited over a surface of wafer 10. BLM layer 26 may include first layer 28 and second layer 30 as described previously. As shown in FIG. 3C, a resist layer 56 is deposited over BLM layer 26. Resist layer 56 may be patterned to create a plurality of openings 33, 35 in resist layer 56.

Figure 3D:
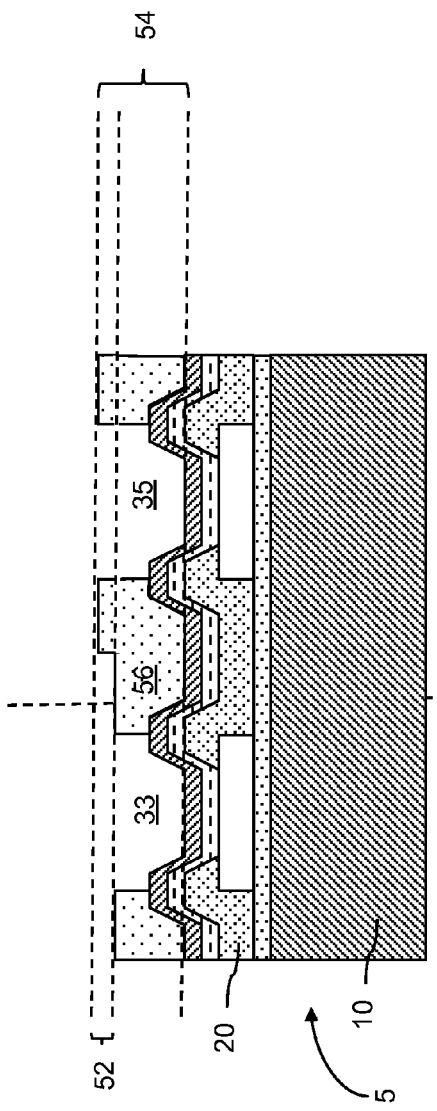

As shown in FIG. 3D, resist layer 56 may be etched, such that a partial thickness 52 of resist layer 56 is removed from an upper surface of resist layer 56 adjacent to a first opening 33. In one embodiment, a reactive ion etch (RIE) may be used to remove the partial thickness 52 of resist layer 56. A full thickness 54 of resist layer 56 is left remaining adjacent to a second opening 35. Thus, second opening 35 is deeper than first opening 33.

Figure 3E:
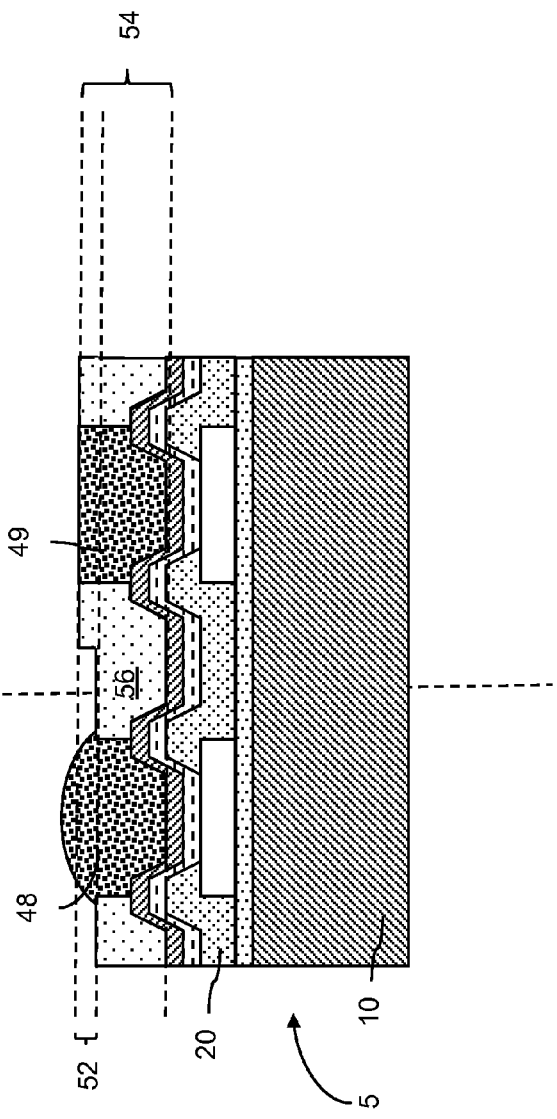

As shown in FIG. 3E, solder structures 48, 49 are deposited in first opening 33 and second opening 35 respectively, e.g., by electroplating. In an embodiment, first solder structure 48 and second solder structure 49 may comprise SnAg. Both first and second solder structures 48, 49 are plated until second solder structure 49 attains a height substantially equivalent to the depth of second opening 35. Second opening 35 is thus filled, and second solder structure 49 remains confined by the side walls of second opening 35 formed by resist layer 56.

As first opening 33 is shallower than second opening 35 owing to the removal of a partial thickness 52 of resist layer 56 adjacent to first opening 33, first solder structure 48 is mushroom plated to a height above the upper surface of resist layer 56. First solder structure 48 is allowed to plate over the top of the upper surface of resist layer 56, overflowing nominally out of first opening 33.

The silver content in a SnAg electroplating deposit is dependent upon the surface concentration of Ag in the plating bath. A plating bath that produces about 1.7% Ag deposited within the confines of resist layer 56 in second opening 35, will produce an approximately 4% Ag solder structure 48 that extends above resist layer 56 as in first opening 33. These compositions and percentages of silver are merely exemplary; various plating baths may be used which may produce first solder structures 48 and second solder structures 49 that have different relative amounts of silver. Regardless, the mushroom plating technique produces a first solder structure 48 which has a higher percentage of silver than a composition of the second solder structure 49 despite being plated simultaneously.

Figure 3F:
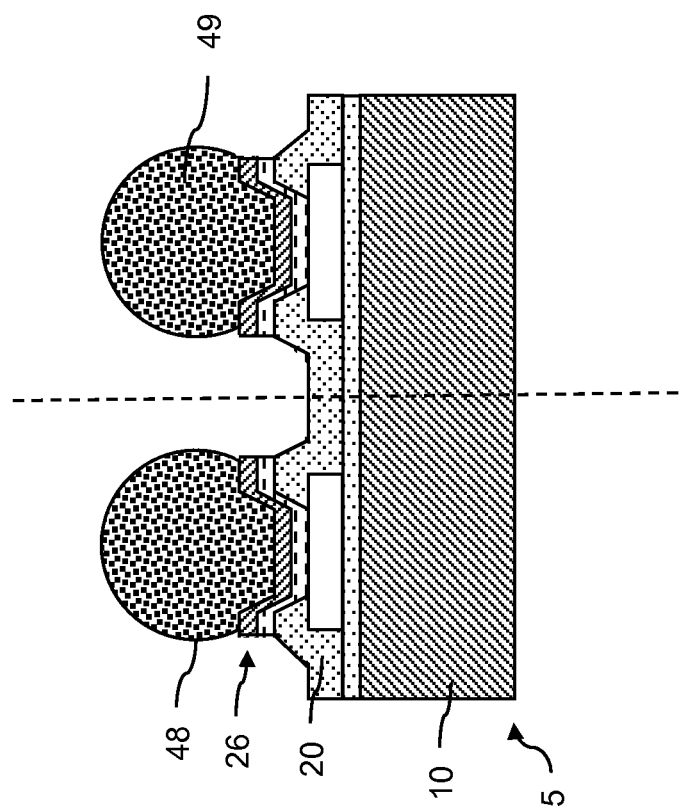

As shown in FIG. 3F, resist layer 56 (FIG. 3E) may be stripped away as described above relative to FIG. 1D. Exposed portions of BLM layer 26, i.e. portions not beneath first and second solder structures 48, 49, may be etched and first and second solder structures 48, 49 may be reflowed and annealed, joining wafer 10 to a package (not shown), also as described above relative to FIG. 1D-G.

Thus formed, first solder structure 48 may have a current carrying capacity of greater than 150 mA, and may particularly be capable of carrying current in excess of 180 mA substantially without experiencing electromigration. Second solder structure 49, by contrast, may have a current carrying capacity of, e.g., less than 150 mA, but is less stiff than first solder structure 48 owing to its relatively lower concentration of silver.

An integrated circuit (IC) chip including selectively formed solder structures having a higher current carrying capability, will now be described with reference to FIGS. 2F, 3F. IC chip 5 includes a wafer 10, which may include a number of electronic circuits manufactured by lithographic processes or patterned diffusion of trace elements into the surface of a wafer 10 in a conventional manner. Wafer 10 may further include a polyimide passivation layer 20 deposited over wafer 10.

A ball limiting metallurgy (BLM) layer 26 may be deposited on an upper surface of the IC chip. BLM layer 26 includes a first layer 28 over passivation layer 20, and a second layer 30 over first layer 28 as described above. A plurality of solder structures 48, 49 may be disposed above BLM layer 26. A least one of the plurality of solder structures 48 may have a first composition, and at least one of the plurality of solder structures 49 may have a second composition. In particular, the first composition of solder structure 48 may include a higher percentage of silver than the second composition of solder structure 49. In one example, which is merely one possible embodiment, the first composition of solder structure 48 is about 2% silver, and the second composition of solder structure 49 is about 0.5% silver. This results in first solder structures 48, made of the first composition, having greater current carrying capacity than the second solder structures 49 having the second composition. This is a result of the relatively greater silver content in first solder structures 48. Conversely, second solder structures 49 are less stiff than first solder structures 48.

Figure 4:
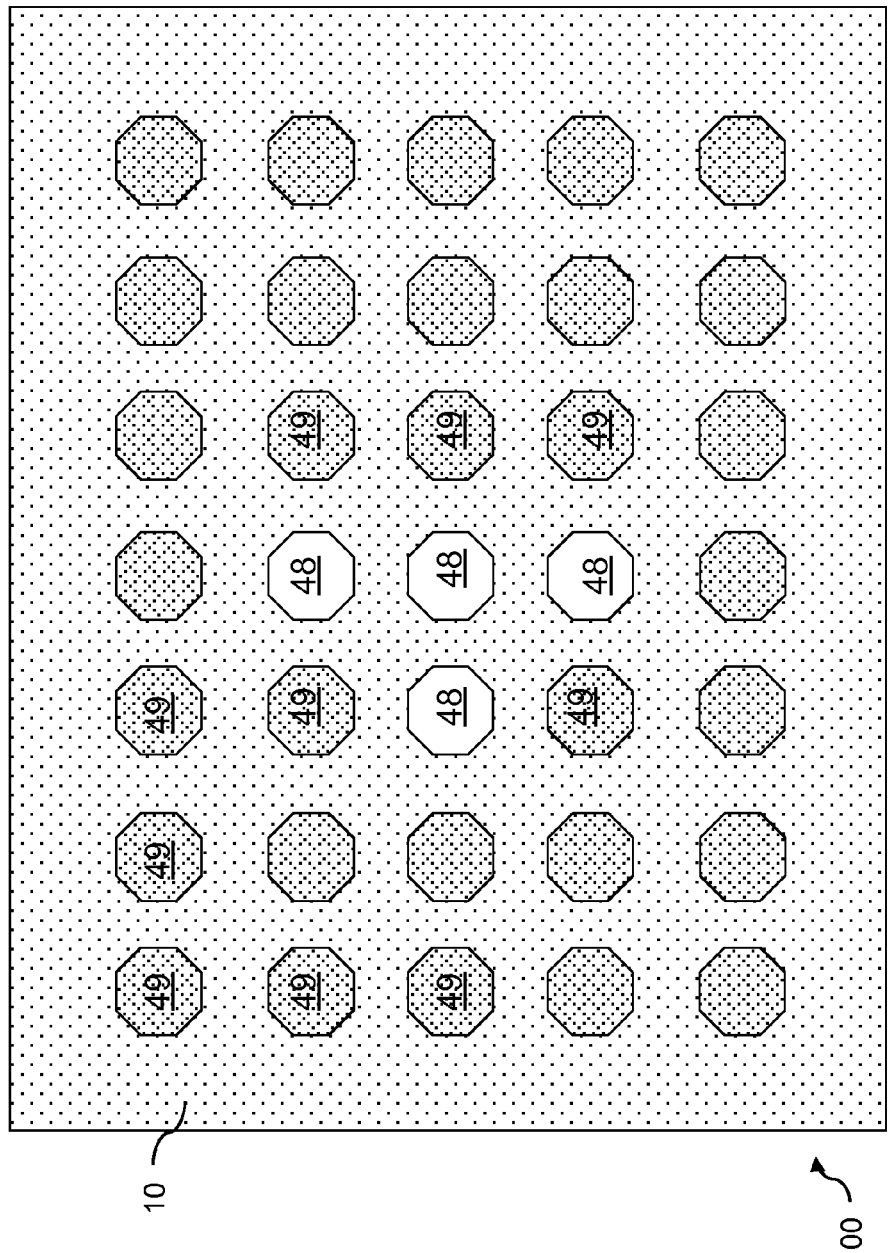
FIG. 4 shows a top view of a wafer in accordance with an embodiment of the invention.

As shown in FIG. 4, solder structures 48, 49 are arranged on wafer 10 in a manner suited to capitalize on the relatively greater current carrying capability of first solder structures 48 made of the first, higher-Ag containing composition, and the relatively less stiff second solder structures 49, made of the second, lower-Ag containing composition. At least one solder structure 48 having the first, higher-Ag containing composition is disposed in a position on the substrate 10 that corresponds to a location having a current per solder structure 48, 49 that exceeds 150 mA in operation. A typical wafer will include a quantity of the second solder structures 49 having the second composition that outnumbers a quantity of first solder structures 48 having the first composition. Further, the first solder structures 48 may be disposed nearer the core of the substrate 10, while the second solder structures 49 may be disposed throughout the substrate 10, including near a periphery thereof.

As in the depiction in FIG. 1G, IC chip 5 of FIG. 4 may be assembled into a flip chip package 100, in which solder structures 48, 49 provide a connection between wafer 10 and an IC chip package 46.

As used herein, the terms "first," "second," and the like, do not denote any order, quantity, or importance, but rather are used to distinguish one element from another, and the terms "a" and "an" herein do not denote a limitation of quantity, but rather denote the presence of at least one of the referenced item. The modifier "about" used in connection with a quantity is inclusive of the stated value and has the meaning dictated by the context (e.g., includes the degree of error associated with measurement of the particular quantity). The suffix "(s)" as used herein is intended to include both the singular and the plural of the term that it modifies, thereby including one or more of that term (e.g., the metal(s) includes one or more metals). Ranges disclosed herein are inclusive and independently combinable (e.g., ranges of "up to about 25 mm, or, more specifically, about 5 mm to about 20 mm," is inclusive of the endpoints and all intermediate values of the ranges of "about 5 mm to about 25 mm," etc.).

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method comprising:
    providing a wafer;
    depositing a ball limiting metallurgy (BLM) layer over a surface of the wafer;
    depositing a first resist layer over the BLM layer;
    patterning the first resist layer to create a plurality of openings in the first resist layer;
    depositing a second resist layer over the first resist layer;
    patterning the second resist layer, wherein the patterning of the second resist layer includes removing the second resist layer from an upper surface of the first resist layer adjacent to a first opening having a first depth in the plurality of openings, and leaving the second resist layer on an upper surface of the first resist layer adjacent to a second opening having a second depth in the plurality of openings, wherein the first depth is shallower than the second depth; and
    electroplating a solder structure into each of the plurality of openings,
    wherein a first solder structure is plated into the first opening to a height above the upper surface of the first resist layer, and
    wherein a second solder structure is plated into the second opening such that it is confined by the second resist layer.

2. The method of claim 1, further comprising:
    stripping the first resist layer and the second resist layer;
    etching an exposed portion of the BLM layer;
    reflowing the plurality of solder structures; and
    annealing the plurality of solder structures to a plurality of solder pads on a package substrate.

3. The method of claim 1, wherein the first solder structure and the second solder structure comprise SnAg.

4. The method of claim 3, wherein a composition of the first solder structure includes a higher percentage of silver than a composition of the second solder structure.

5. The method of claim 1, wherein the first solder structure has a current carrying capacity of greater than 150 mA, and the second solder structure has a current carrying capacity of less than 150 mA.

6. The method of claim 5, wherein the first solder structure further has a current carrying capacity of greater than 180 mA.

7. The method of claim 5, further comprising:
    electroplating the first solder structure in a position on the wafer that corresponds to a location having a current per solder structure that exceeds 150 mA in operation; and
    electroplating the second solder structure in a position on the wafer that corresponds to a location having a current per solder structure that is less than 150 mA.

8. A method comprising:
    providing a wafer;
    depositing a ball limiting metallurgy (BLM) layer over a surface of the wafer;
    depositing a first resist layer over the BLM layer;
    patterning the first resist layer to create a plurality of openings;
    etching the first resist layer, wherein etching the first resist layer includes removing a partial thickness of the first resist layer from an upper surface of the first resist layer adjacent to a first opening having a first depth, and leaving a full thickness of the first resist layer adjacent to a second opening having a second depth, wherein the first depth is shallower than the second depth;
    electroplating a solder structure into each of the plurality of openings,
    wherein a first solder structure is plated into the first opening to a height above the upper surface of the first resist layer, and
    wherein a second solder structure is plated into the second opening such that it is confined by the full thickness of the first resist layer.

9. The method of claim 8, further comprising:
    stripping the first resist layer;
    etching an exposed portion of the BLM layer;
    reflowing the plurality of solder structures; and
    annealing the plurality of solder structures to a plurality of solder pads on a package substrate.

10. The method of claim 8, wherein the first solder structure and the second solder structure comprise SnAg.

11. The method of claim 10, wherein a composition of the first solder structure includes a higher percentage of silver than a composition of the second solder structure.

12. The method of claim 8, wherein etching the first resist layer further comprises using a reactive ion etch (RIE).

13. The method of claim 8, wherein the first solder structure has a current carrying capacity of greater than 150 mA, and the second solder structure has a current carrying capacity of less than 150 mA.

14. The method of claim 13, wherein the first solder structure further has a current carrying capacity of greater than 180 mA.

15. The method of claim 13, further comprising:
    electroplating the first solder structure in a position on the wafer that corresponds to a location having a current per solder structure that exceeds 150 mA in operation; and
    electroplating the second solder structure in a position on the wafer that corresponds to a location having a current per solder structure that is less than 150 mA.

* * * * *